(12) United States Patent
Pore et al.

(10) Patent No.: US 9,523,148 B1
(45) Date of Patent: Dec. 20, 2016

(54) PROCESS FOR DEPOSITION OF TITANIUM OXYNITRIDE FOR USE IN INTEGRATED CIRCUIT FABRICATION

(71) Applicant: ASM IP Holding B.V., Almere (NL)

(72) Inventors: Viljami J. Pore, Helsinki (FI); Seiji Okura, Sagamihara (JP); Hidemi Suemori, Helsinki (FI)

(73) Assignee: ASM IP HOLDINGS B.V., Almere (NL)

( * ) Notice: Subject to any disclaimer, the term of this patent is extended or adjusted under 35 U.S.C. 154(b) by 0 days.

(21) Appl. No.: 14/835,465

(22) Filed: Aug. 25, 2015

(51) Int. Cl.
| C23C 16/30 | (2006.01) |
| H01L 21/02 | (2006.01) |
| H01L 21/311 | (2006.01) |
| C23C 16/455 | (2006.01) |
| H01L 21/28 | (2006.01) |

(52) U.S. Cl.
CPC ......... *C23C 16/308* (2013.01); *C23C 16/4554* (2013.01); *C23C 16/45525* (2013.01); *C23C 16/45531* (2013.01); *C23C 16/45534* (2013.01); *C23C 16/45553* (2013.01); *H01L 21/0228* (2013.01); *H01L 21/02186* (2013.01); *H01L 21/02205* (2013.01); *H01L 21/02249* (2013.01); *H01L 21/02271* (2013.01); *H01L 21/02274* (2013.01); *H01L 21/28202* (2013.01); *H01L 21/31111* (2013.01); *H01L 21/31122* (2013.01); *H01L 21/31144* (2013.01)

(58) Field of Classification Search
None
See application file for complete search history.

(56) References Cited

U.S. PATENT DOCUMENTS

| 5,625,217 A | 4/1997 | Chau et al. |
| 5,783,478 A | 7/1998 | Chau et al. |
| 6,066,533 A | 5/2000 | Yu |
| 6,166,417 A | 12/2000 | Bai et al. |

(Continued)

FOREIGN PATENT DOCUMENTS

| EP | 0854 505 | 7/1998 |
| WO | WO 94/14198 | 6/1994 |

(Continued)

OTHER PUBLICATIONS

H. Kim et al., Thin Solid Films vol. 517, year 2009, pp. 2563-2580.*

(Continued)

*Primary Examiner* — Jiong-Ping Lu
(74) *Attorney, Agent, or Firm* — Knobbe Martens Olson & Bear LLP

(57) ABSTRACT

A process is provided for depositing a substantially amorphous titanium oxynitride thin film that can be used, for example, in integrated circuit fabrication, such as in forming spacers in a pitch multiplication process. The process comprises contacting the substrate with a titanium reactant and removing excess titanium reactant and reaction byproducts, if any. The substrate is then contacted with a second reactant which comprises reactive species generated by plasma, wherein one of the reactive species comprises nitrogen. The second reactant and reaction byproducts, if any, are removed. The contacting and removing steps are repeated until a titanium oxynitride thin film of desired thickness has been formed.

19 Claims, 7 Drawing Sheets

(56) References Cited

U.S. PATENT DOCUMENTS

| | | | |
|---|---|---|---|
| 6,225,168 | B1 | 5/2001 | Gardner et al. |
| 6,265,258 | B1 | 7/2001 | Liang et al. |
| 6,291,282 | B1 | 9/2001 | Wilk et al. |
| 6,335,240 | B1 | 1/2002 | Kim et al. |
| 6,368,954 | B1 | 4/2002 | Lopatin et al. |
| 6,373,111 | B1 | 4/2002 | Zheng et al. |
| 6,383,879 | B1 | 5/2002 | Kizilyalli et al. |
| 6,407,435 | B1 | 6/2002 | Ma et al. |
| 6,458,695 | B1 | 10/2002 | Lin et al. |
| 6,482,740 | B2 | 11/2002 | Soininen et al. |
| 6,506,676 | B2 | 1/2003 | Park et al. |
| 6,511,876 | B2 | 1/2003 | Buchanan et al. |
| 6,518,106 | B2 | 2/2003 | Ngai et al. |
| 6,534,395 | B2 | 3/2003 | Werkhoven et al. |
| 6,537,901 | B2 | 3/2003 | Cha et al. |
| 6,579,767 | B2 | 6/2003 | Park et al. |
| 6,596,576 | B2 | 7/2003 | Fu et al. |
| 6,613,695 | B2 | 9/2003 | Pomarede et al. |
| 6,627,503 | B2 | 9/2003 | Ma et al. |
| 6,660,660 | B2 | 12/2003 | Haukka et al. |
| 6,696,332 | B2 | 2/2004 | Visokay et al. |
| 6,700,771 | B2 | 3/2004 | Bhattacharyya |
| 6,703,708 | B2 | 3/2004 | Werkhoven et al. |
| 6,713,846 | B1 | 3/2004 | Senzaki |
| 6,714,435 | B1 | 3/2004 | Dimmler et al. |
| 6,717,226 | B2 | 4/2004 | Hegde et al. |
| 6,723,581 | B1 | 4/2004 | Chabal et al. |
| 6,730,163 | B2 | 5/2004 | Vaartstra |
| 6,730,588 | B1 | 5/2004 | Schinella |
| 6,806,145 | B2 | 10/2004 | Haukka et al. |
| 6,858,524 | B2 | 2/2005 | Haukka et al. |
| 7,045,406 | B2 | 5/2006 | Huotari et al. |
| 7,575,826 | B2 | 8/2009 | Mantese et al. |
| 8,945,675 | B2 | 2/2015 | Pore et al. |
| 2001/0041250 | A1 | 11/2001 | Werkhoven et al. |
| 2002/0008257 | A1 | 1/2002 | Barnak et al. |
| 2002/0030235 | A1 | 3/2002 | Agarwal et al. |
| 2002/0096724 | A1 | 7/2002 | Liang et al. |
| 2003/0072975 | A1 | 4/2003 | Shero et al. |
| 2003/0165615 | A1 | 9/2003 | Aaltonen et al. |
| 2004/0036129 | A1 | 2/2004 | Forbes et al. |
| 2005/0045092 | A1 | 3/2005 | Wu et al. |
| 2005/0073803 | A1 | 4/2005 | Cho |
| 2006/0163655 | A1 | 7/2006 | Hoffman et al. |
| 2006/0205143 | A1 | 9/2006 | Govindarajan |
| 2007/0006798 | A1 | 1/2007 | Vaartsra et al. |
| 2007/0093018 | A1 | 4/2007 | Marsh |
| 2009/0214927 | A1* | 8/2009 | Dadheech ............ H01M 8/0206 429/434 |
| 2012/0064689 | A1 | 3/2012 | Hirota et al. |

FOREIGN PATENT DOCUMENTS

| | | |
|---|---|---|
| WO | WO 01/29893 | 4/2001 |
| WO | WO 01/66832 | 9/2001 |
| WO | WO 02/43115 | 5/2002 |
| WO | WO 02/50922 | 6/2002 |

OTHER PUBLICATIONS

Apetrei et al., "Photo-degradation activity of sputter-deposited nitrogen-doped titania thin films", Thin Solid Films, May 31, 2009, 15 pages.

Asahi et al., "Visible-Light Photocatalysis in Nitrogen-Doped Titanium Oxides", Science Magazine, vol. 293, Jul. 13, 2001, 3 pages.

Bai et al., "Monodisperse Nanoparticle Synthesis by an Atmospheric Pressure Plasma Process: An Axample of a Visible Light Photocatalyst", American Chemical Society, Jul. 21, 2004, 4 pages.

Batzill et al., "Influence of Nitrogen Doping on the Defect Formation and Surface Properties of $TiO_2$ Rutile and Anatase", Physical Review Letters, American Physical Society, Jan. 20, 2006, 4 Pages.

Beranek & Kisch., "Surface-modified anodic TiO2 films for visible light photocurrent response", Electrochemistry Communications, vol. 9, 2007, pp. 761-766.

Burda et al., "Enhanced Nitrogen Doping in $TiO_2$ Nanoparticles", Nano Letters, vol. 3(8), 2003, pp. 1049-1051.

Chang et al., "Photocatalytic performance of chromium or nitrogen doped arc ion plated-$TiO_2$ films", Surface & Coatings Technology, 2005, 5 pages.

Chappe et al., "Influence of substrate temperature on titanium oxynitride thin films prepared by reactive sputtering", Applied Surface Science, vol. 225, 2004, pp. 29-38.

Chen & Burda., "Photoelectron Spectroscopic Investigation of Nitrogen-Doped Titania Nanoparticles", Journal of Physical Chemistry, American Chemical Society, Aug. 26, 2004, pp. 15446-15449.

Chen et al., "Investigation of nitrogen doped $TiO_2$ photocatalytic films prepared by reactive magnetron sputtering" Catalysis Communications, vol. 5, 2004, pp. 677-680.

Cheng et al., "Visible Light Activity of Nitrogen-Doped $TiO_2$ Thin Films Grown by Atomic Layer Deposition", Electrochemical and Solid-State Letters, vol. 11(10), 2008, pp. D81-D84.

Cong et al., "Synthesis and Characterization of Nitrogen-Doped $TiO_2$ Nanophotocatalyst with High Visible Light Activity" J. Phys. Chem., vol. 111, 2007, pp. 6976-6982.

Diwald et al., "Photochemical Activity of Nitrogen-Doped Rutile $TiO_2$(110) in Visible Light", J. Phys. Chem. B, 108, 2004, pp. 6004-6008.

Diwald et al., "The Effect of Nitrogen Ion Implantation on the Photoactivity of $TiO_2$ Rutile Single Crystals", J. Phys. Chem. B, vol. 108, 2004, pp. 52-57.

Emeline et al., "Spectral Dependences of the Activity and Selectivity of N-doped $TiO_2$ in Photodegradation of Phenols", Journal of Photochemistry and Photobiology A: Chemistry, (2008), doi:10.1016/j.jphotochem.2009.01.001.

Gole et al., "Highly Efficient Formation of Visible Light Tunable $TiO_{2-x}N_x$ Photocatalysts and Their Transformation at the Nanoscale" J. Phys. Chem. B, 2003, 11 pages.

Guo et al., "Investigation of structure and properties of N-doped $TiO_2$ thin films grown by APCVD", Materials Science and Engineering B, vol. 135, 2006, pp. 83-87.

Ihara et al., "Visible-light-active titanium oxide photocatalyst realized by an oxygen-deficient structure and by nitrogen doping", Applied Catalysis B: Environmental 42 (2003), pp. 403-409.

Irie et al., "Nitrogen-Concentration Dependence on Photocatalytic Activity of $TiO_{2-x}N_x$ Powders", J. Phys. Chem. B, vol. 107, 2003, pp. 5483-5486.

Kobayakawa et al., "Visible-light active N-doped $TiO_2$ prepared by heating of titanium hydroxide and urea", Journal of Photochemistry and Photobiology A: Chemistry, vol. 170, 2005, pp. 177-179.

Kosowska et al., "The preparation of $TiO_2$—nitrogen doped by calcination of $TiO_2$—$_xH_2O$ under ammonia atmosphere for visible light photocatalysis" Solar Energy Materials & Solar Cells, vol. 88, 2005, pp. 269-280.

Kumar et al., "Photodegradation of ethylene using visible light responsive surfaces prepared from titania nanoparticle slurries", Applied Catalysis B: Environmental, vol. 57, 2005, pp. 93-107.

Kuroda et al., "Preparation of Visible-Light-Responsive $TiO_{2-x}N_x$ Photocatalyst by a Sol-Gel Method: Analysis of the Active Center on $TiO_2$ that Reacts with $NH_3$", Langmuir, vol. 21, 2005, pp. 8026-8034.

Lee et al., "Metalorganic chemical vapor deposition of $TiO_2$:N anatase thin film on Si substrate", American Institute of Physics, Feb. 13, 1995, 66(7).

Li et al., "Highly Active $TiO_2$N Photocatalysts Prepared by Treating $TiO_2$ Precursors in $NH_3$/Ethanol Fluid under Supercritical Conditions", J. Phys. Chem. B, vol. 110, 2006, pp. 1559-1565.

Lindgren et al., "Photoelectrochemical and Optical Properties of Nitrogen Doped Titanium Dioxide Films Prepared by Reactive DC Magnetron Sputtering", J. Phys. Chem. B, vol. 107, 2003, pp. 5709-5716.

Liu et al., "Photocatalytic degradation of azo dyes by nitrogen-doped $TiO_2$ nanocatalysts" Chemosphere, vol. 61, 2005, pp. 11-18.

Matsumoto et al., "High visible-light photocatalytic activity of nitrogen-doped titania prepared from layered titania/isostearate nanocomposite" Catalysis Today, vol. 120, 2007, pp. 226-232.

(56) References Cited

OTHER PUBLICATIONS

Morikawa et al., "Band-Gap Narrowing of Titanium Dioxide by Nitrogen Doping" The Japan Journal of Applied Physics, vol. 40, 2001, pp. 561-563.
Mozia et al., "Decomposition of nonionic surfactant on a nitrogen-doped photocatalyst under visible-light irradiation", Applied Catalysis B: Environmental, vol. 55, 2005, pp. 195-200.
Mrowetz et al., "Oxidative Power of Nitrogen-Doped $TiO_2$ Photocatalysts under Visible Illumination" Journal of Physical Chemistry, American Chemical Society, Aug. 30, 2004, 5 pages.
Nakamura et al., "Mechanism for Visible Light Responses in Anodic Photocurrents at N-Doped $TiO_2$ Film Electrodes" J. Phys. Chem. B, vol. 108, 2004, pp. 10617-10620.
Pore et al., "Atomic layer deposition of $TiO_{2-x}N_x$ thin films for photocatalytic applications", Journal of Photochemistry and Photobiology A: Chemistry, vol. 177, 2006, pp. 68-75.
Pore, "Atomic Layer Deposition and Photocatalytic Properties of Titanium Dioxide Thin Films" University of Helsinki, Academic Dissertation, 2010, 89 pages.
Pradhan & Reucroft, "A study of growth and morphological features of $TiO_xN_y$ thin films prepared by MOCVD", Journal of Crystal Growth, vol. 250, 2003, pp. 588-594.
Sakthivel et al., "Visible Light Activity and Photoelectrochemical Properties of Nitrogen-Doped $TiO_2$", J. Phys. Chem. B, Sep. 29, 2004, 4 pages.
Suda et al., "Preparation of high quality nitrogen doped $TiO_2$ thin film as a photocatalyst using a pulsed laser deposition method", Thin Solid Films, 453-454, 2004, pp. 162-166.
Suda et al., "Preparation of nitrogen-doped titanium oxide thin film using a PLD method as parameters of target material and nitrogen concentration ratio in nitrogen/oxygen gas mixture", Thin Solid Films, vol. 475, 2005, pp. 337-341.
Torres et al., "Photoelectrochemical Study of Nitrogen-Doped Titanium Dioxide for Water Oxidation" J. Phys. Chem. B, vol. 108, 2004, pp. 5995-6003.
Valentin et al., "Characterization of Paramagnetic Species in N-Doped $TiO_2$ Powders by EPR Spectroscopy and DFT Calculations" Journal of Physical Chemistry B Letters, vol. 109, May 21, 2005, pp. 11414-11419.
Valentin et al., "Origin of the different photoactivity of N-doped anatase and rutile $TiO_2$," Physical Review B 70, Aug. 30, 2004, 4 pages.
Vilhunen & Sillanpaa, "Atomic layer deposited (ALD) $TiO_2$ and $TiO_{2-x}$—$N_x$ thin film photocatalysts in salicylic acid decomposition", Water Science & Technology, 60.10, 2009, pp. 2471-2475.
Wan et al., "Improved optical response and photocatalysis for N-doped titanium oxide ($TiO_2$) films prepared by oxidation of TiN" Applied Surface Science, vol. 253, 2007, pp. 4764-4767.
Wong et al., "Reactively sputtered N-doped titanium oxide films as visible-light photocatalyst" Thin Solid Films, vol. 494, 2006, pp. 244-249.
Xu et al., "Studies on characteristics of nanostructure of $N-TiO_2$ thin films and photo-bactericidal action", Journal of Zhejiang University Science B, 2006, 7(7): pp. 586-590, Guangzhou, China.
Yang et al., "Effect of $N_2$ ion flux on the photocatalysis of nitrogen-doped titanium oxide films by electron-beam evaporation", Applied Surface Science, (252) Jul. 14, 2005, pp. 3729-3736.
Yang et al., "IR and XPS investigation of visible-light photocatalysis-Nitrogen-carbon-doped $TiO_2$ film", Applied Surface Science, vol. 253, 2006, pp. 1988-1994.
Yang et al., "Nitrogen-doped titanium oxide films as visible light photocatalyst by vapor deposition", Thin Solid Films, vol. 469-470, 2004, pp. 1-5.
Yates et al., "The role of nitrogen doping on the development of visible light-induced photocatalytic activity in thin $TiO2$ films grown on glass by chemical vapour deposition", Journal of Photochemistry and Photobiology A: Chemistry, vol. 179, 2006, pp. 213-223.
Yin et al., "Low temperature synthesis of $TiO_{2-x}N_y$ powders and films with visible light responsive photocatalytic activity", Solid State Communications, vol. 137, 2006, pp. 132-137.
Yin et al., "Preparation of nitrogen-doped titania with high visible light induced photocatalytic activity by mechanochemical reaction of titania and hexamethylenetetramine", Journal of Materials Chemistry, Oct. 17, 2003, vol. 13., pp. 2996-3001.
Yin et al., "Synthesis of excellent visible-light responsive $TiO_{2-x}N_y$ photocatalyst by a homogeneous precipitation-solvothermal process", Journal of Materials Chemistry, vol. 15, 2005, pp. 674-682.
Zhipeng et al., "In-Situ Nitrogen Doping of the TiO2 Photocatalyst Deposited by PEALD for Visible Light Activity", Plasma Science and Technology, vol. 16, No. 3, pp. 239-243, Mar. 2014.
1988RD-0296076, "Field Effect Transistor Structure with Improved Transconductance—Contg. Spacer-less Conducting Gate Oxide and Tungsten Deposition on Source and Drain," Anonymous.
Brezeanu, G. et al., *High-K Dielectrics in Nano & Microelectronics*, Nat'l Seminar of Nanoscience & Nanotechnology, September edition (2010).
Chatterjee et al., "CMOS Metal Replacement Gate Transistors using Tantalum Pentoxide Gate Insulator," IEEE, IEDM, 0-7803-4774-9/98, pp. 777-780 (1998).
Chen et al., "0.18 µm Metal Gate Fully-Depleted SOI MOSFETs for Advanced CMOS Applications," Symposium on VLSI Technology Digest of Technological Papers, pp. 25-26 (1999).
Diebold, Ulrike, The surface science of Titatnium Dioxide, Surface Science Report, 48 (2003) pp. 53-229.
Ducroquet et al., "Full CMP Integration of CVD TiN Damascene Sub-0.1- µm Metal Gate Devices for ULSI Applications," IEEE Transactions on Electron Devices, vol. 48, No. 8, pp. 1816-1821(2001).
Ferguson et al., "Titanium Nitride Metal Gate Electrode: Effect of Nitrogen Incorporation," Advanced Metallization Conference 2001 (AMC 2001), pp. 115-119.
Furubayashi et al., "Novel transparent conducting oxide: Anatase $Ti_{1-x}Nb_xO_2$", Thin Solid Films 496 (2006) 157-159.
Gillispie et al. "rf magnetron sputter deposition of transparent conducting Nb-doped TiO2 films on SrTiO3" Journal of Applied Physics 101, 033125 (2007).
Hitosugi et al. "Fabrication of highly conductive Ti1—xNbxO2 polycrystalline films on glass substrates via crystallization of amorphous phase grown by pulsed laser deposition" Applied Physics Letters 90, 212106 (2007).
Hobbs et al., "Sub-Quarter Micron CMOS Process for TiN-Gate MOSFETs with $TiO_2$ Gate Dielectric formed by Titanium Oxidation," Advanced Products Research and Development Lab, Symposium on VLSi Technology Digest of Technical Papers, pp. 133-134 (1999).
Kafizas et al., "$TiO_2$-based transparent conducting oxides; the search for optimum electrical conductivity using a combinatorial approach," Journal of Materials Chemistry C, 2013, 1, 6335-6346.
Leskela et al. Atomic layer deposition (ALD): from precursor to thin film structures, Thin Solid Films 409 (2002) pp. 138-146.
Lim et al., "Chaacteristics of $TiO_x$ films prepared by chemical vapor deposition using tetrakis-dimethyl-amido-titanium and water," Thin Solid Films 498, (2006), pp. 254-258.
Maiti et al., "PVD TiN Metal Gate MOSFETs on Bulk Silicon and Fully Depleted Silicon-on-Insulator (FDSOI) Substrates for Deep Sub-Quarter Micron CMOS Technology," IEEE, IEDM, 0-7803-4774-9/98, pp. 781-784 (1998).
Matero et al., "Effect of water dose on the automatic layer deposition of oxide thin films," Elsevier, *Thin Solid Films* 368 (2000) pp. 1-7.
Park et al., "Robust Ternary Metal Gate Electrodes for Dual Gate CMOS Devices," IEEE, IEDM, 0-7803-7050-3/02, pp. 671-674 (2001).
Polishchuk, "Dual Work Function Metal Gate CMOS Technology Using Metal Interdiffusion," IEEE Electron Device Letter, vol. 22, No. 9, pp. 444-446 (2001).
Robertson, J., *Band Offsets of High Dielectric Constant Gate Oxides on Silicon*, J. Non-Crystalline Solids 303 (2002) pp. 94-100.
Suntola, T. "Atomic Layer Epitaxy," *Handbook of Crystal Growth*, vol. 3, Chapter 14, NH 1994, pp. 605-663.

(56) References Cited

OTHER PUBLICATIONS

Wakabayashi et al., "A Novel W/TiNx Metal Gate CMOS Technology using Nitrogen-Concentration-Controlling TiNx Film," IEEE, IEDM, 0-7803-5410-9/99, pp. 253-256 (1999).

Yagishita et al., "High Performance Damascene Metal Gate MOSFET's for 0.1 μm Regime," IEEE Transactions on Electron Devices, vol. 47, No. 5, pp. 1028-1034 (2000).

Yagishita et al., Reduction of Threshold Voltage Deviation in Damascene Metal Gate MOSFET's, IEEE, IEDM, 0-7083-5410-9/99, pp. 257-260 (1999).

Yeo et al., "Dual-Metal Gate CMOS Technology with Ultrathin Silicon Nitride Gate Dielectric," IEEE Electronic Device Letters, vol. 22, No. 5, pp. 227-229 (2001).

Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.

\* cited by examiner

PROCESS FOR DEPOSITION OF TITANIUM OXYNITRIDE FOR USE IN INTEGRATED CIRCUIT FABRICATION

BACKGROUND

Field of the Invention

This invention relates generally to the field of semiconductor device fabrication and, more particularly, to the deposition of titanium oxynitride ($TiO_xN_y$). The titanium oxynitride can be used, for example, in processes for forming integrated circuits.

Description of Related Art

There is an extremely high demand for integrated circuits to be decreased in size. This demand stems, for example, from a need for increased portability, increased computing power, increased memory capacity, and increased energy efficiency. In order to decrease the size of integrated circuits, the sizes of the constituent features, electrical devices and interconnect lines, for example, must be reduced as well.

The demand for reduced size has moved the industry to continuously reduce constituent feature size in integrated circuits. For example, memory circuits or devices such as dynamic random access memories (DRAMs), flash memory, static random access memories (SRAMs), ferroelectric (FE) memories are continuously being made smaller.

One example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute, for example, a memory cell and the sizes of the conducting lines that access the memory cells, the memory devices can be made smaller. Additionally, storage capacities can be increased by fitting more memory cells on a given area in the memory devices.

The continual reduction in feature size places ever greater demands on the techniques used to form the features. Photolithography, for example, is commonly used to pattern features, such as conductive lines. When dealing with photolithography, the concept of pitch can be used to describe the sizes of these features. Pitch is defined as the distance between an identical point in two neighboring features. These features are typically defined by the spaces between themselves, spaces that are typically filled by a material, such as an insulator. As a result, pitch can be viewed as the sum of the width of a feature and of the width of the space on one side of the feature separating that feature from a neighboring feature. However, due to factors such as the optics, or the wavelength of light used in the technique, photolithographic techniques each have a minimum pitch below which a particular photolithographic technique cannot reliably form features. Thus, the minimum pitch of a photolithographic technique is an obstacle to continued feature size reduction.

Pitch doubling, pitch multiplication, or spacer defined double/quadruple patterning is a method for extending the capabilities of photolithographic techniques beyond their minimum pitch. During a pitch doubling process a spacer film layer is formed or deposited over an existing mask feature. The spacer film is then etched, preferably using a directional etch, such as a reactive ion etch, thereby leaving only the spacer, or the material extending or formed from the sidewalls of the original mask feature. Upon removal of the original mask feature, only the spacer remains on the substrate. Thus, where a given pitch previously included a pattern defining one feature and one space, the same width now includes two features and two spaces, with the spaces defined by, in this instance, the spacers. As a result, the smallest feature size possible with a photolithographic technique is effectively decreased. While the pitch is actually halved in the above example, this reduction in pitch is referred to as pitch "doubling," because the linear density of features has been doubled. The process as described above can be performed additional times, using the newly formed spacers as the original mask feature to again reduce the pitch by half, or quadruple the linear density of features.

In spacer applications, such as in the pitch multiplication process as described above, materials with specific etch characteristics are required for device fabrication. The original mask feature in a pitch multiplication process is typically thermal silicon dioxide ($SiO_2$), with hydrofluoric acid used to etch, or remove, the mask feature. It is preferable that the thermal $SiO_2$ mask feature is etched away completely while the spacer material remains intact. Therefore, spacer film materials with lower etch rates than that of thermal $SiO_2$ in hydrofluoric acid are needed.

Additionally, because spacers are formed on the sidewalls of pre-patterned features, spacer films are preferably conformal. In order to achieve this conformality, deposition techniques such as atomic layer deposition (ALD) or plasma enhanced atomic layer deposition (PEALD) are typically used. The template materials used in pitch multiplication processes, such as SOC materials, can also lower the allowed thermal budget, thereby favoring lower temperature deposition techniques like PEALD.

Titanium dioxide ($TiO_2$) is a material which has favorable etch selectivity compared to thermal $SiO_2$, and can be conformally grown by PEALD at relatively low temperatures. Tetrakis(dimethylamido)titanium (TDMAT) or other alkylamides are typically used as titanium precursors, while $O_2$ plasma is typically used as an oxygen precursor. $TiO_2$, however, crystallizes easily, causing roughness in the spacer film which renders the resulting spacer unacceptable for its intended use. Although in some conditions smooth, amorphous, $TiO_2$ could possibly be grown as a thin film, it may be difficult up to about 20 nm thick, and above that the growth of thicker $TiO_2$ films leads almost surely to crystallization.

Accordingly, there is a need for methods of forming or depositing conformal thin films that are smooth and amorphous, yet are capable of being deposited to thicknesses greater than is known in the art, while still retaining favorable etch selectivity towards $SiO_2$

SUMMARY OF THE INVENTION

According to one aspect of the present invention, processes are provided for depositing a titanium oxynitride thin films that can be used, for example, in integrated circuit fabrication. The process comprises contacting the substrate with a titanium reactant and removing excess titanium reactant and reaction byproducts, if any, such as by exposing the substrate to a purge gas and/or vacuum. The substrate is then contacted with a second reactant which comprises a plurality of reactive species generated by plasma, wherein the plurality of reactive species comprises nitrogen and oxygen. The ratio of nitrogen reactive species to oxygen reactive species may be from about 1:2 to about 250:1. The substrate may be exposed to a purge gas and/or vacuum to remove excess second reactant and reaction byproducts, if any. The contacting and exposing steps are repeated until a titanium oxynitride thin film of desired thickness has been formed. The titanium oxynitride thin film may comprise from about 0.05 at-% to about 30 at-% of nitrogen.

In some embodiments the processes may be used in integrated circuit fabrication, for example to form spacers. In some embodiments the process may be used to form spacers for use in pitch multiplication processes. In some embodiments the titanium oxynitride film may be substantially amorphous. In some embodiments the substrate may comprise a preexisting mask feature. In some embodiments the titanium reactant may comprise an alkylamine ligand. In some embodiments the titanium reactant may comprise $Ti(NR^IR^{II})_4$, wherein $R^I$ and $R^{II}$ can be independently selected to be alkyl groups. In some embodiments the second reactant may comprise a nitrogen precursor and an oxygen precursor. In some embodiments the nitrogen precursor may comprise $N_2$, $NH_3$, or $N_2H_2$. In some embodiments the oxygen precursor may comprise $O_2$. In some embodiments the reactive species may comprise nitrogen atoms, nitrogen ions, nitrogen radicals, or nitrogen plasma and oxygen atoms, oxygen radicals, or oxygen plasma. In some embodiments deposition may be carried out at a temperature of, preferably from about 70° to about 200° C. In some embodiments the process may be a plasma enhanced atomic layer deposition process.

According to another aspect of the present invention, processes are provided for depositing a titanium oxynitride thin film. The processes may comprise at least one deposition cycle, each cycle comprising alternately and sequentially contacting the substrate with a titanium reactant and a second reactant comprising a plurality of reactive species, wherein a ratio of nitrogen reactive species to oxygen reactive species is from about 1:2 to about 250:1. The titanium oxynitride thin film may comprise from about 0.05 at-% to about 30 at-% of nitrogen.

In some embodiments the process may be used to form spacers for use in integrated circuit fabrication. In some embodiments the titanium reactant may have the formula $Ti(NR^IR^{II})_4$, wherein $R^I$ and $R^{II}$ can be independently selected to be Me or Et. In some embodiments the second reactant may comprise a nitrogen precursor and an oxygen precursor. In some embodiments the reactive species may comprise nitrogen atoms, nitrogen ions, nitrogen radicals, or nitrogen plasma and oxygen atoms, oxygen radicals, or oxygen plasma. In some embodiments the process may be a plasma enhanced atomic layer deposition processes.

According to another aspect of the present invention, processes are provided in which titanium oxide is deposited on a three-dimensional feature of a substrate, such as in forming a spacer for use in a pitch multiplication process. The process may comprise conformally depositing a substantially amorphous titanium oxynitride thin film via PEALD over an existing mask feature in a reaction space. The conformal titanium oxynitride thin film is preferentially etched from the horizontal surface of the substrate and mask feature. The mask feature is then preferentially etched and the titanium oxynitride deposited on or extending from a vertical surface of the mask feature remains relatively unetched.

In some embodiments the titanium oxynitride film may be used to form spacers. In some embodiments the spacers may be used in a pitch multiplication process. In some embodiments preferentially etching the titanium oxynitride film from horizontal surfaces may comprise a reactive ion etch. In some embodiments preferentially etching the mask feature may comprise a hydrofluoric acid wet etch. In some embodiments the substrate may comprise silicon. In some embodiments the mask feature may comprise $SiO_2$. In some embodiments conformally depositing a substantially amorphous titanium oxynitride thin film via PEALD over an existing mask feature on a substrate in a reaction space may comprise alternately and sequentially contacting the substrate with a titanium reactant and a second reactant comprising a plurality of reactive species. In some embodiments the second reactive species has a ratio of nitrogen reactive species to oxygen reactive species that may be from about 1:2 to about 250:1. In some embodiments the titanium oxynitride thin film may comprise from about 0.05 at-% to about 30 at-% of nitrogen.

DETAILED DESCRIPTION OF THE PREFERRED EMBODIMENT

Figure 1:
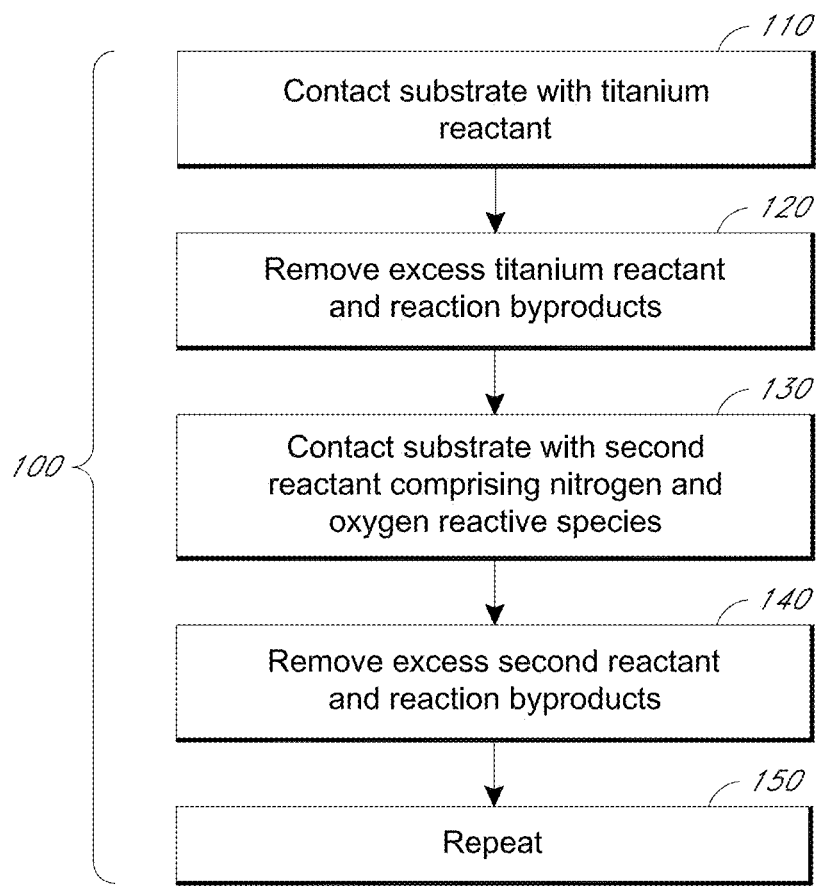
FIG. 1 is a flow chart illustrating a process for depositing a titanium oxynitride thin film by a plasma enhanced ALD process according to some embodiments of the present disclosure.

Crystallization in $TiO_2$ thin films can be suppressed by adding foreign atoms to the material. In preferred embodiments of the present invention, nitrogen atoms are present in the plasma during plasma enhanced atomic layer deposition (PEALD), thereby depositing nitrogen doped $TiO_2$, or titanium oxynitride ($TiO_xN_y$). The resultant $TiO_xN_y$ deposited by PEALD will be less crystalline than pure $TiO_2$ grown at the same deposition conditions.

In some common integrated circuit fabrication processes, for example, pitch multiplication processes, the spacers and original mask feature are simultaneously exposed to an etchant, typically hydrofluoric acid, which preferentially etches the original mask feature. As titanium dioxide has etch selectivity towards silicon based materials such as silicon dioxide, an $SiO_2$ mask feature can be preferentially etched while a $TiO_2$ spacers that have been conformally deposited on the side walls of the mask feature can remain relatively unetched. Therefore, etch selectivity relative to $SiO_2$ is an important characteristic of any material comprising a spacer. Although foreign atoms can be introduced into the spacer material, it is important that these foreign atoms not significantly impair the etch selectivity of the spacer material. Additionally, titanium oxynitride films deposited according to the processes described herein may be useful as a sacrificial film in, for example, patterning applications.

Additionally, titanium is an oxyphilic element, meaning that titanium preferentially combines with oxygen atoms. Therefore, large nitrogen to oxygen ratios are needed in the plasma during the PEALD process in order to deposit $TiO_xN_y$ with a sufficient amount of nitrogen incorporated into the material to achieve a smooth, amorphous film.

In view of these difficulties, preferred embodiments disclosed herein allow for conformal deposition of substantially amorphous $TiO_xN_y$ thin films that are less crystalline than pure $TiO_2$, but still retain etch selectivity relative to $SiO_2$. These films can be used, for example, as sacrificial films in patterning application and as spacers in integrated circuit formation, such as in a pitch multiplication process.

PEALD Processes

In some embodiments, plasma enhanced ALD (PEALD) processes are used to deposit $TiO_xN_y$ films. Briefly, a substrate or workpiece is subjected to alternately repeated surface reactions. In some embodiments, thin $TiO_xN_y$ films are formed by repetition of an ALD cycle. Preferably, for forming $TiO_xN_y$ films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, alkylamine titanium compound, such as TDMAT. In a second phase, a second reactant comprising a reactive species or multiple reactive species contacts the substrate surface and may convert adsorbed titanium to $TiO_xN_y$. In some embodiments the second reactant comprises an oxygen precursor and a nitrogen precursor. In some embodiments, the reactive species comprises one or more excited species. In some embodiments the second reactant comprises one or more species from a nitrogen and oxygen containing plasma. In some embodiments, the second reactant comprises nitrogen radicals, nitrogen atoms, and/or nitrogen plasma and oxygen radicals, oxygen atoms, and/or oxygen plasma. The second reactant may comprise other species that are not nitrogen or oxygen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments the substrate is contacted with a first reactant and the substrate is moved such that it is contacted with a second reactant. In some embodiments the substrate can be moved within a single reaction space. In some embodiments the substrate can be moved from a first reaction space to a second, different reaction space.

The substrate can comprise various types of materials. The substrate may be, for example, a semiconductor substrate. In some embodiments the substrate may comprise silicon. In some embodiments the substrate may comprise at least one of silicon dioxide and silicon nitride.

As discussed in more detail below, in some embodiments for depositing a $TiO_xN_y$ film, one or more deposition cycles begin with contacting the substrate surface with the titanium precursor, followed by the second reactant. In other embodiments deposition may begin with contacting the surface with the second reactant, followed by the titanium precursor.

In some embodiments, if necessary, the exposed surfaces of the substrate or workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are typically removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films. In some other embodiments the reaction chamber is purged by stopping the flow of a precursor or reactant and continuing to flow carrier gas into the chamber. In some embodiments excess reactant and reaction byproducts are removed from the vicinity of the substrate by moving the substrate. In some embodiments the substrate is moved within a reaction chamber. In some embodiments the substrate is moved from a first reaction chamber to a second, different reaction chamber.

As mentioned above, in some embodiments a carrier gas is provided to the reaction chamber continuously during each deposition cycle, or during the entire ALD process, and reactive species are provided. Reactive species may be provided by generating a plasma in the gas, either in the reaction chamber or upstream of the reaction chamber, and may also be provided by injection into the carrier gas. In some embodiments the carrier gas may comprise helium, or argon. In some embodiments the carrier gas may also serve as a purge gas for the first and/or second reactant (or reactive species). In some embodiments the purge gas may be a reactant, for example, flowing the second reactant may serve as a purge gas for a first titanium precursor and also serve as reactive species when a plasma is formed in the gas. In some embodiments, nitrogen, argon, or helium may serve as a purge gas for a first precursor and a source of excited species for converting the titanium precursor into the $TiO_xN_y$ film.

The ALD cycle is repeated until a film of the desired thickness and composition is obtained. In some embodiments the deposition parameters, such as the flow rate, flow time, contact time, purge time, removal time, RF Power, RF on time and/or precursors themselves, may be varied in one or more deposition cycles during the ALD process in order to obtain a film with the desired characteristics.

The term "pulse" may be understood to comprise feeding reactant into the reaction chamber for a predetermined amount of time. The term "pulse" does not restrict the length or duration of the pulse and a pulse can be any length of time.

In some embodiments, the titanium precursor contacts the substrate first. After an initial surface termination, if necessary or desired, the substrate is contacted with a titanium precursor. In accordance with some embodiments, the titanium precursor contacts the substrate via a first titanium precursor pulse comprising a carrier gas flow and a volatile titanium species, such as TDMAT, that is reactive with the substrate surfaces of interest. Accordingly, the titanium precursor adsorbs upon these substrate surfaces. The first precursor self-saturates the substrate surfaces such that any excess constituents of the first precursor pulse do not further react with the molecular layer formed by this process.

The titanium precursor preferably contacts the substrate in gaseous form. The titanium precursor gas is considered "volatile" for purposes of the present description if the species exhibits sufficient vapor pressure under the process conditions to transport the species to the substrate in sufficient concentration to saturate exposed surfaces. In some embodiments the titanium precursor contacts the substrate by injecting the titanium precursor into the carrier gas. In some other embodiments the titanium precursor contacts the substrate separately from any carrier gas or inert gas flow.

In some embodiments the titanium precursor contact duration is from about 0.05 to about 10.0 seconds, preferably from about 0.1 to about 5 seconds and more preferably from about 0.1 to about 1.0 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

After sufficient time for a molecular layer to adsorb on the substrate surface, excess titanium precursor is then removed from the substrate surface. In some embodiments the excess titanium precursor is removed by stopping the flow of the titanium precursor while continuing to flow a carrier gas or purge gas for a sufficient time to diffuse or purge excess reactants and reactant by-products, if any, from the reaction space. In some embodiments the excess titanium precursor is removed with the aid of an inert gas that is flowing throughout the ALD cycle. In some embodiments the titanium precursor is removed by stopping the flow of the titanium precursor and starting to flow a carrier gas or purge gas. In some embodiments the titanium precursor is removed from the substrate surface by moving the substrate within a reaction chamber. In some embodiments the titanium precursor is removed from the substrate surface by moving the substrate from a first reaction chamber to a second, different reaction chamber.

In some embodiments the titanium precursor contact duration is from about 0.05 to about 10.0 seconds, preferably from about 0.1 to about 5 seconds and more preferably from about 0.1 to about 2.0 seconds. In some embodiments the appropriate titanium precursor removal duration can be longer or shorter, depending on the particular circumstances. The appropriate removal duration can be readily determined by the skilled artisan based on the particular circumstances. The typical precursor purge duration is also about 0.1 to about 1.0 seconds. This is also depends on each condition.

In the second phase, a plurality of reactive species, such as a plasma comprising oxygen and nitrogen reactive species contact the surface of the substrate. A carrier gas may be flowed continuously to the reaction chamber during each ALD cycle in some embodiments. A plasma may be formed by generating a plasma in the second reactant in the reaction chamber or upstream of the reaction chamber, for example by flowing the second reactant through a remote plasma generator. In some embodiments, plasma is generated in the flowing second reactant. In some embodiments the second reactant contacts the surface of the substrate before the plasma is ignited or nitrogen and oxygen atoms or radicals are formed. In some embodiments the second reactant is introduced into the reaction chamber by injecting the second reactant into a carrier gas. In some other embodiments the second reactant contacts the surface of the substrate separately from any carrier gas or inert gas.

In some embodiments the titanium precursor contact duration is from about 0.05 to about 10.0 seconds, preferably from about 0.1 to about 5 seconds and more preferably from about 0.1 to about 2.0 seconds. In some embodiments the appropriate second reaction contact duration can be longer or shorter depending on the particular circumstances. The appropriate contact duration can be readily determined by the skilled artisan based on the particular circumstances.

In some embodiments the substrate may be contacted with the second reactant while the titanium precursor is still present at the substrate surface. In some embodiments the second reactant may contact the substrate prior to the removal of the titanium precursor from the surface of the substrate. In some embodiments the substrate may be contacted with the titanium precursor while the second reactant is still present at the substrate surface. In some embodiments the titanium precursor may contact the substrate prior to the removal of the second reactant from the surface of the substrate.

After a time period sufficient to completely saturate and react the previously adsorbed molecular layer with the plasma pulse, any excess reactant and reaction byproducts are removed from the substrate surface. As with the removal of the first reactant/precursor, in some embodiments this step may comprise stopping the generation of reactive species in the second reactant and continuing to flow the carrier gas for a time period sufficient for excess reactive species and volatile reaction by-products to diffuse out of and be purged from the reaction space. In some other embodiments removal may comprise stopping generating reactive species in the second reactant, stopping the flow of the second reactant, and continuing to flow the carrier gas. In other embodiments the generation of reactive species in the second reactant is stopped and a separate purge gas may be used. In some embodiments the generation of reactive species in the second reactant is stopped, the flow of second reactant into the reaction chamber is stopped, and separate purge gas may be used. In some embodiments the substrate is moved such that the second reactant/precursor no longer contacts the substrate. In some embodiments the substrate is moved within a reaction chamber. In some embodiments the substrate is moved from a first reaction chamber to a second, different reaction chamber. Together, the second reactant plasma provision and removal represent a second phase in a titanium oxynitride atomic layer deposition cycle.

In some embodiments the titanium precursor contact duration is from about 0.05 to about 10.0 seconds, preferably from about 0.1 to about 5 seconds and more preferably from about 0.1 to about 2.0 seconds. In some embodiments the appropriate second precursor removal duration can be longer or shorter, depending on the particular circumstances. The appropriate removal duration can be readily determined by the skilled artisan based on the particular circumstances. A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 10 W to about 2000 W, preferably from about 100 W to about 1000 W and more preferably from about 200 W to about 500 W. In some embodiments RF power may be more than 2000 W if it is desired and for example, if the substrate tolerates it without damage.

The two phases together represent one ALD cycle, which is repeated to form $TiO_xN_y$ thin films of a desired thickness. While the ALD cycle is generally referred to herein as beginning with the titanium precursor phase, it is contemplated that in other embodiments the cycle may begin with the second reactant phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the titanium phase.

Additional phases may be added and phases may be removed as desired to adjust the composition of the final film. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

According to some embodiments of the present disclosure, PEALD reactions may be performed at temperatures ranging from about 20° C. to about 500° C., preferably from about 20° C. to about 450° C., more preferably from about 50° C. to about 300° C. and most preferably from about 70° C. to about 200° C. In some embodiments the PEALD reactions may be performed at pressures ranging from about 10 Pa to about 2000 Pa, preferably from about 100 Pa to about 1000 Pa, more preferably from about 200 Pa to about 400 Pa.

FIG. 1 is a flow chart generally illustrating a titanium oxynitride plasma enhanced ALD deposition cycle that can be used to deposit a titanium oxynitride thin film in accordance with some embodiments on the invention. According to certain embodiments, a titanium oxynitride thin film is formed on a substrate by an ALD-type process comprising multiple titanium oxynitride deposition cycles, each titanium oxynitride deposition cycle 100 comprising:

(1) contacting a substrate with a titanium reactant 110 such that the titanium compound adsorbs on the substrate surface;

(2) removing excess titanium precursor and any byproducts from the substrate surface 120;

(3) contacting the substrate with a second reactant 130 comprising a plurality of reactive species generated by plasma, the plurality of reactive species comprising nitrogen and oxygen; and (4) removing excess second reactant and reaction byproducts from the substrate surface 140.

The contacting and removing steps are repeated 150 until a thin film of a desired thickness and composition is obtained.

According to some embodiments a titanium oxynitride plasma enhanced ALD deposition cycle can be used to deposit a titanium oxynitride thin film. In certain embodiments, a titanium oxynitride thin film is formed on a substrate by an ALD-type process comprising multiple titanium oxynitride deposition cycles, each titanium oxynitride deposition cycle comprising:

(1) contacting a substrate with a titanium reactant such that the titanium compound adsorbs on the substrate surface;

(2) exposing the substrate to a purge gas and/or vacuum;

(3) contacting the substrate with a second reactant comprising a plurality of reactive species generated by plasma, the plurality of reactive species comprising nitrogen and oxygen; and (4) exposing the substrate to a purge gas and/or vacuum.

The contacting and removing steps are repeated until a thin film of a desired thickness and composition is obtained.

In some embodiments the exposing the substrate to a purge gas and/or vacuum steps may comprise continuing the flow of an inert carrier gas while stopping the flow of a precursor or reactant. In some embodiments the exposing the substrate to a purge gas and/or vacuum steps may comprise stopping the flow of a precursor and a carrier gas into a reaction chamber and evacuating the reaction chamber, for example with a vacuum pump. In some embodiments the exposing the substrate to a purge gas and/or vacuum steps may comprise moving the substrate from a first reaction chamber to a second, different reaction chamber containing a purge gas. In some embodiments the exposing the substrate to a purge gas and/or vacuum steps may comprise moving the substrate from a first reaction chamber to a second, different reaction chamber under a vacuum.

In certain embodiments, a titanium oxynitride thin film is formed on a substrate by an ALD-type process comprising multiple titanium oxynitride deposition cycles, each titanium oxynitride deposition cycle comprising: alternately and sequentially contacting the substrate with a first titanium reactant and a second reactant comprising reactive species. In some embodiments the second reactive species may comprise Ti Precursors A number of suitable titanium precursors can be used in the presently disclosed PEALD processes for forming $TiO_xN_y$. In some embodiments the titanium precursor comprises an organometallic precursor. In some embodiments the titanium precursor is tetravalent (that is, Ti has an oxidation state of +IV). In some embodiments the titanium precursor comprises at least one alkylamide ligand. In some embodiments the titanium precursor comprises at least one halide ligand. In some embodiments the titanium precursor does not comprise a halide ligand. In some embodiments the titanium precursor does not comprise four halide ligands. In some embodiments the titanium precursor may comprise at least one amine or alkylamine ligand, $-NR^IR^{II}$, wherein $R^I$ and $R^{II}$ can be independently chosen from alkyl ligands, preferably ethyl or methyl. In some embodiments the titanium precursor may comprise at least one alkoxide ligand.

In some embodiments the titanium precursor may comprise a heteroleptic compound. In some embodiments the titanium precursor comprises tetrakis(dialkylamino)titanium compounds $Ti(NR^{I}R^{II})_4$, such as tetrakis(dimethylamino)titanium (TDMAT) $Ti(NMe_2)_4$.

In some embodiments the titanium precursor comprises a halide ligand. In some embodiments the titanium precursor comprises at least one of $TiCl_4$, $TiF_4$, $TiI_4$, $TiBr_4$. In some instances halide ligands at certain process parameter, such as at high temperature ranges may promote crystallization of $TiO_2$ crystals and promote roughness and/or reduce smoothness in a thin film. However, in certain embodiments halide ligands may be used while still providing reduced crystallization and roughness as compared to pure $TiO_2$ films of a similar thickness.

In some embodiments the titanium precursor comprises at least one alkyl or substituted alkyl ligand. In some embodiments the titanium precursor comprises an alkoxide. In some embodiments the titanium precursor comprises at least one of titanium methoxide $Ti(OMe)_4$, titanium ethoxide $Ti(OEt)_4$, and titanium isopropoxide ($Ti(O^iPr)_4$ or TTiP).

In some embodiments the titanium precursor comprises at least one amine or alkylamine ligand. In some embodiments the titanium precursor comprises at least one of $Ti(NMeEt)_4$ (TEMAT), $Ti(N(Et)_2)_4$ (TDEAT), and $Ti(N(Me)_2)_4$ (TDMAT).

In some embodiments the titanium precursor comprises a heteroleptic precursor. In some embodiments the titanium precursor comprises at least one of $Ti(O^iPr)_2(dmae)_2$, $Ti(Me_5Cp)(OMe)_3$, $Ti(MeCp)(OMe)_3$, $TiCp(NMe_2)_3$, $Ti(Me_5Cp)(NMe_2)_3$, $Ti(mpd)(thd)_2$, and $Ti(O^iPr)_2(thd)_2$. In some embodiments the titanium precursor comprises a cyclic ligand, such as a cyclopentadienyl or a derivative of a cyclopentadienyl ligand. In some embodiments the titanium precursor has at least one Ti—N bond. In some embodiments the titanium precursor has at least one —Ti—N—C— bond structure.

In some embodiments more than one titanium precursor may contact the substrate surface at the same time during an ALD phase. In some embodiments the titanium precursor may comprises more than one titanium reactant. In some embodiments a first titanium precursor is used in a first ALD cycle and a second, different titanium precursor is used in a later ALD cycle. In some embodiments multiple titanium precursors may be used during a single ALD phase, for example, in order to optimize certain properties of the deposited $TiO_xN_y$ film.

Second Reactant

As discussed above, the second reactant in a PEALD process used to form $TiO_xN_y$ according to the present disclosure may comprise a nitrogen precursor and an oxygen precursor, which may comprise plasma generated from oxygen and nitrogen precursors. Suitable plasma compositions include nitrogen plasma, radicals of nitrogen, or atomic nitrogen, and oxygen plasma, radicals of oxygen, or atomic oxygen in one form or another. In some embodiments a plasma may also contain hydrogen, such as hydrogen plasma, radicals of hydrogen, or atomic hydrogen in one form or another. And in some embodiments, a plasma may also contain noble gases, such as He, Ne, Ar, Kr and Xe, preferably Ar or He, in plasma form, as radicals, or in atomic form. In some embodiments, the second reactant does not comprise any species from a noble gas, such as Ar. Thus, in some embodiments plasma is not generated in a gas comprising a noble gas.

In some embodiments the second reactant may comprise plasma formed from both compounds having N and compounds having O, such as a mixture of $N_2$ and $O_2$, or a mixture of $NH_3$ and $O_2$. In some embodiments the second reactant may comprise plasma from compounds having O and may not comprise compounds having N. In some embodiments the second reactant may be formed at least in part, from an N-containing compound and an O-containing compound, where the N-containing compound and O-containing compound are provided at a ratio (N-containing compound/O-containing compound) from about 1:1 to about 100:1, preferably from about 10:1 to about 30:1. In some embodiments the ratio is from about 1:2 to about 250:1. In some embodiments the ratio is about 19:1. In some embodiments the second reactant may be formed at least in part, from $N_2$ and $O_2$, where the $N_2$ and $O_2$ are provided at a ratio ($N_2/O_2$) from about 1:1 to about 100:1, preferably from about 10:1 to about 30:1. In some embodiments the second reactant may be formed at least in part, from $NH_3$ and $O_2$, where the $NH_3$ and $O_2$ are provided at a ratio ($NH_3/O_2$) from about 1:1 to about 100:1, preferably from about 10:1 to about 30:1.

In some embodiments wherein the deposited film comprises carbon the second reactant may be formed at least in part, from an N-containing compound and an O-containing compound, where the N-containing compound and O-containing compound are provided at a ratio (N-containing compound/O-containing compound) from about 1:1 to about 100:1, preferably from about 10:1 to about 30:1 and more preferably about 19:1. In some embodiments ratio is from about 1:2 to about 250:1. In some embodiments the second reactant may comprise plasma formed from both compounds having N and compounds having O, such as a mixture of $N_2$ and $O_2$. In some embodiments the second reactant may be formed at least in part, from $N_2$ and $O_2$, where the $N_2$ and $O_2$ are provided at a ratio ($N_2/O_2$) from about 1:1 to about 100:1, preferably about 19:1.

In some embodiments the second reactant may comprise plasma formed from both compounds having N and compounds having O. In some embodiments the second reactant may not comprise plasma formed from compounds having N. Where the second reactant comprises a compound having N, the compounds having N may be selected from at least one of $N_2$, $NH_3$, $N_2H_4$ and $N_2H_2$. The compounds having O may be selected from at least one of $O_3$, $N_2O$, $CO_2$, CO, $H_2O$, and $H_2O_2$. It is to be noted that the ratio reactive species, like of N and O species, may be different before plasma ignition (i.e. gas flow ratios) and after plasma ignition (reactive species ratio).

The second reactant may be formed in some embodiments remotely via plasma discharge ("remote plasma") away from the substrate or reaction space. In some embodiments, the second reactant may be formed in the vicinity of the substrate or directly above substrate ("direct plasma").

In some embodiments the second reactant may be provided into a reaction chamber. In some embodiments a suitable second reactant can include compounds having N, compounds having O, and an inert carrier gas. Various reactant flow rates can be suitable. In some embodiments the second reactant may comprise N2, O2, and Ar. In some embodiments a flow rate for N2 is from about 0 slm to about 10 slm. In some embodiments a flow rate for 02 is from about 0.001 slm to about 10 slm. In some embodiments a flow rate for Ar is from about 0 slm to about 10 slm.

$TiO_xN_y$ Film Characteristics $TiO_xN_y$ thin films deposited according to some of the embodiments discussed herein may comprise nitrogen. In some embodiments the ratio of nitrogen to oxygen in the second reactant when depositing a $TiO_xN_y$ thin film is from about 1:1 to about 100:1, preferably from about 10:1 to about 30:1 and more preferably about 19:1. In some embodiments the ratio of oxygen to nitrogen in a $TiO_xN_y$ thin film is from about 1:2 to about 1000:1, preferably from about 1:1 to about 500:1 and more preferably about 10:1 to about 500:1. In some embodiments the amount of nitrogen in the deposited $TiO_xN_y$ thin film is from about 0.05 at-% to about 30 at-%, more preferably from about 0.1 at-% to about 10 at-% and most preferably from about 0.2 at-% to about 5 at-%. In some instances the amount of nitrogen is less than about 1 at -%. In some instances the amount of nitrogen is more than about 0.2 at -%. In some instances the amount of nitrogen is more than about 1 at -%.

In some embodiments the deposited $TiO_xN_y$ thin film does not comprise an appreciable amount of carbon. However, in some embodiments a $TiO_xN_y$ film comprising carbon is deposited. For example, in some embodiments an ALD reaction is carried out using a titanium precursor comprising carbon and a thin $TiO_xN_y$ film comprising carbon is deposited. In some embodiments the amount of O containing compound in the second reactant can be decreased in order to increase the amount of carbon present in the deposited $TiO_xN_y$ thin film. In some embodiments the amount of carbon in the deposited $TiO_xN_y$ thin film is from about 0.05 at-% to about 30 at-%, more preferably from about 0.1 at-% to about 10 at-% and most preferably from about 0.1 at-% to about 5 at-%. In some instances the amount of carbon is less than about 1 at -%.

In some embodiments, $TiO_xN_y$ films are deposited to a thicknesses of from about 1 nm to about 50 nm, preferably from about 3 nm to about 30 nm, more preferably from about 5 nm to about 20 nm. These thicknesses can be achieved in feature sizes (width) below about 100 nm, preferably about 50 nm, more preferably below about 30 nm, most preferably below about 20 nm, and in some cases below about 15 nm. According to some embodiments, a $TiO_xN_y$ film is deposited on a three-dimensional structure and the thickness at a sidewall may be slightly even more than 10 nm.

In some embodiments amorphous $TiO_xN_y$ films of greater than 50 nm can be grown. In some embodiments $TiO_xN_y$ films of greater than 100 nm can be grown. In some embodiments, the film is from about 1 nm to about 200 nm thick, preferably from about 2 nm to about 100 nm thick. In some embodiments the film is from about 1 nm to about 20 nm thick. In some embodiments the film is from about 1 nm to about 10 nm thick.

According to some embodiments $TiO_xN_y$ films with various wet etch rates (WER) may be deposited. In some embodiments the WER is from about 0.01 nm/min to about 200 nm/min, preferably from about 0.01 nm/min to about 50 nm/min. When using a blanket WER in 1% dHF (nm/min), deposited $TiO_xN_y$ films may have WER values substantially similar to those of pure titanium oxide. In some embodiments the deposited $TiO_xN_y$ thin film may have a WER of about 5.2 nm/min.

In some embodiments $TiO_xN_y$ films with various dry etch rates (DER) may be deposited. In some embodiments a $TiO_xN_y$ film may have a DER for a common chlorine based etchant gas, such as $BCl_3$ gas, that is about 5 to about 15 times larger than a DER of Tox (thermal oxide). In some embodiments a $TiO_xN_y$ thin film may have a DER for a common fluorine based gas, such as $CF_4$ gas, that is less than about half of a DER of Tox. In some embodiments, the DER of a $TiO_xN_y$ thin film is less than the etch rate of thermal oxide, preferably less than about 0.5 times the thermal oxide etch rate, while in other embodiments the DER of a $TiO_xN_y$ thin film is more than about 5 larger than a thermal oxide etch rate.

According to some embodiments, the $TiO_xN_y$ thin films may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in aspect ratios of more than about 2 and aspect ratios more than about 3, preferably in aspect ratios more than 5, more preferably in aspect ratios more than 10 and most preferably in aspect ratios more than 15. In some embodiments deposited $TiO_xN_y$ thin films may exhibit substantially the same conformality as titanium oxide films of the same thickness.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field and/or vs. feature dimensions and spacings).

In some embodiments a deposited $TiO_xN_y$ thin film may have a roughness (RMS) of less than about 0.5 nm, preferably less than about 0.3 nm, more preferably less than about 0.2 nm and most preferably less or equal to about 0.15 nm. In some embodiments a deposited $TiO_xN_y$ thin film is less crystalline than a pure $TiO_2$ thin film of the same thickness and deposited with the same precursors.

Integrated Circuit Fabrication Processes

The PEALD process described herein can be used to form $TiO_xN_y$ films for use, for example, in integrated circuit fabrication. A $TiO_xN_y$ film may be used as, for example, a sacrificial film in patterning application, or may be used as spacers for use in pitch multiplication processes. By way of example, in a pitch multiplication process, $TiO_xN_y$ is conformally deposited via plasma enhanced ALD in a reaction space on a substrate comprising an existing mask feature. The conformal, smooth, and substantially amorphous $TiO_xN_y$ film can then be directionally etched so that $TiO_xN_y$ is removed from the horizontal surfaces of the mask feature and substrate, leaving only the $TiO_xN_y$ deposited on or extending from the sidewalls of the mask feature. The mask feature can then be removed via an etching process, leaving behind the pitch doubled $TiO_xN_y$ features.

In preferred embodiments of the invention the ratio of nitrogen precursor to oxygen precursor comprising the second reactant in the PEALD process is such that the resultant titanium oxynitride thin film is substantially amorphous when or if grown thicker than 50 nm. As a consequence of remaining substantially amorphous, the resultant $TiO_xN_y$ thin film is smooth enough for use as a in a variety of contexts, for example as a spacer or sacrificial film. In preferred embodiments of the invention a $TiO_xN_y$ thin film is grown via PEALD that is substantially free of crystallites.

In some embodiments the ratio of nitrogen precursor to oxygen precursor is such that the resultant $TiO_xN_y$ thin film is substantially less crystalline than a pure $TiO_2$ thin film grown at the same deposition conditions. In some embodiments of the invention the titanium oxynitride thin film has etch selectivity towards $SiO_2$, that is an etchant will preferentially etch $SiO_2$ as compared to the $TiO_xN_y$ film. In preferred embodiments of the invention, the $TiO_xN_y$ film has a substantially similar etch selectivity towards $SiO_2$ to pure $TiO_2$.

Figure 2A:
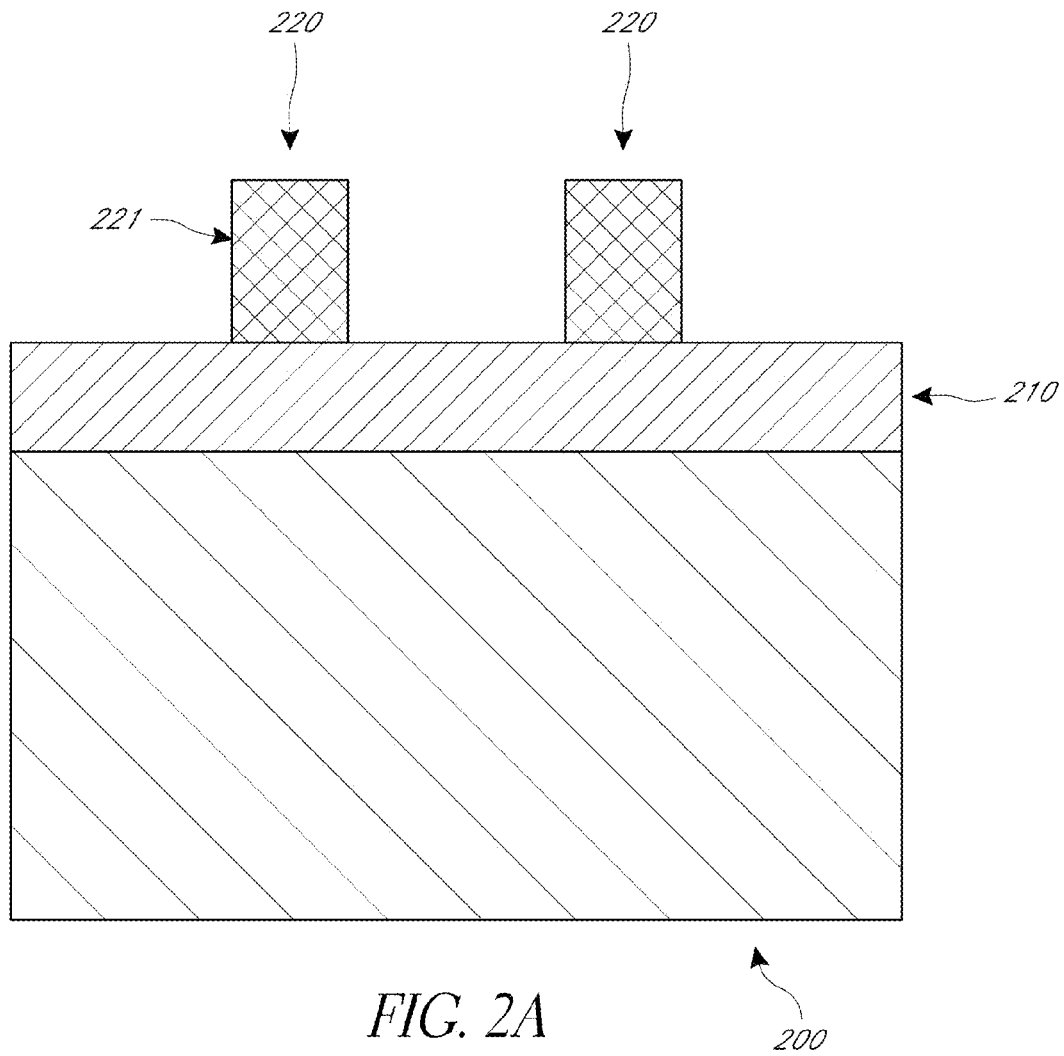
FIG. 2A illustrates a cross-sectional view of a step of an exemplary spacer deposition process according to some embodiments.

With reference to FIG. 2A, and in some embodiments of the present invention the substrate comprises a thermal $SiO_2$ layer 210 on a silicon substrate 200. In some embodiments the substrate comprises a silicon based layer, such as a Si, $SiO_2$ or $SiN_x$ layer on a silicon substrate. In some embodiments the substrate comprises a sacrificial layer. In some embodiments the substrate comprises a polymer or photoresist film. In preferred embodiments of the invention the substrate comprises at least one mask feature 220, such as a three-dimensional raised feature. In preferred embodiments the mask feature comprises an elevated structure that includes substantially vertical sidewalls 221. In some embodiments of the invention the mask feature is photolithographically formed by transferring a pattern formed in a photoresist layer to a $SiO_2$ layer on a silicon substrate.

Figure 2B:
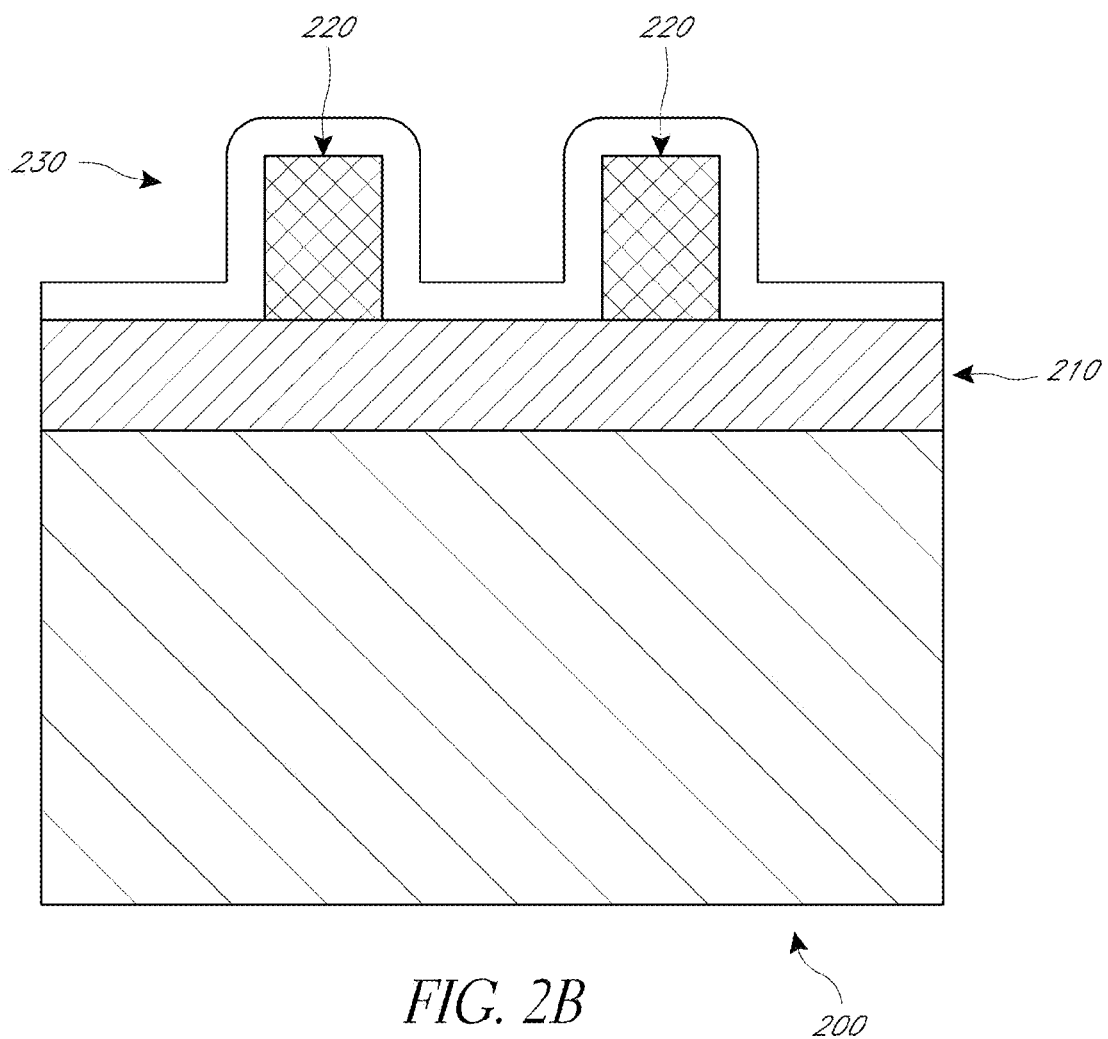
FIG. 2B illustrates a cross-sectional view of a step of an exemplary spacer deposition process according to some embodiments.
Figure 2C:
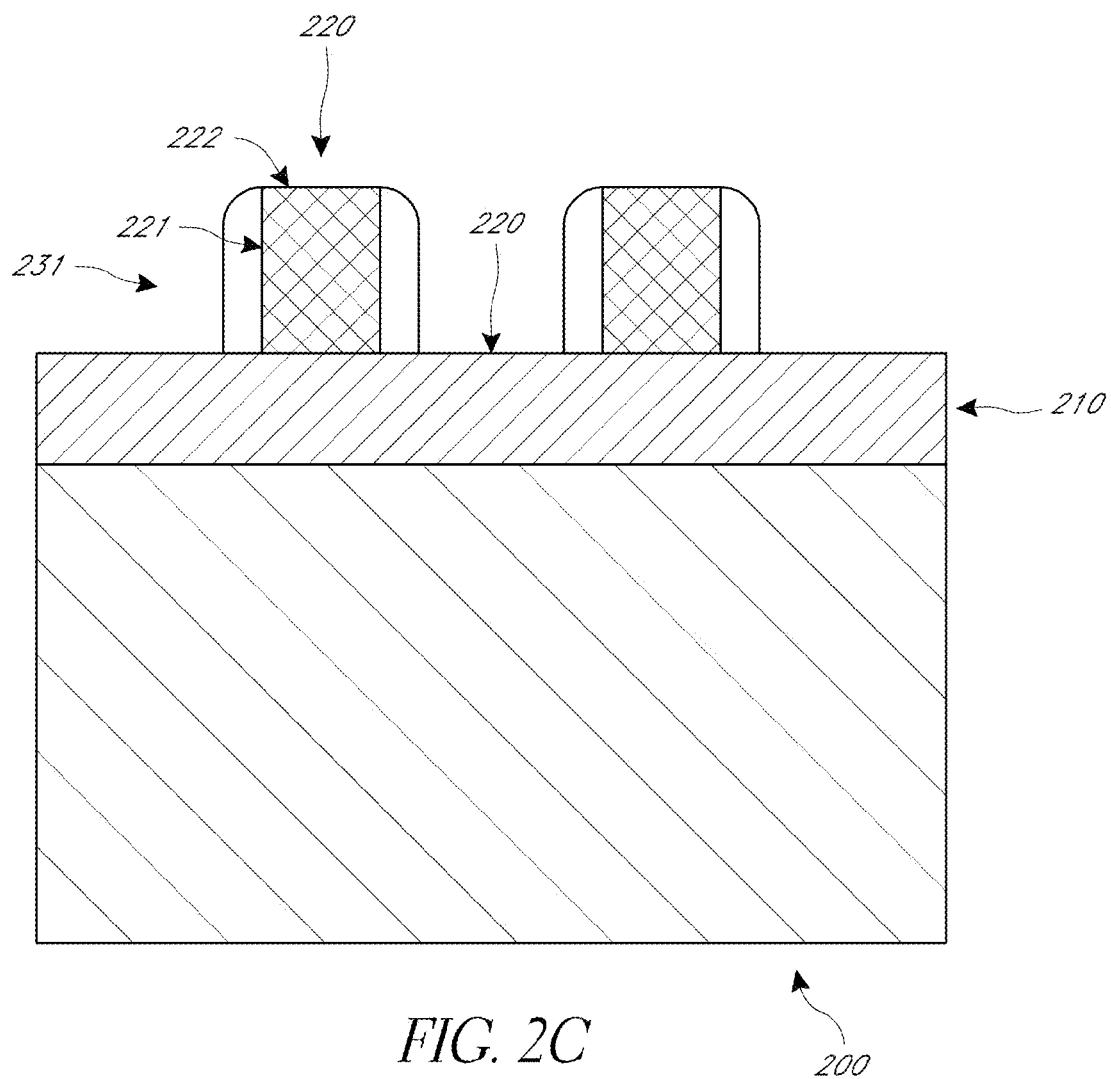
FIG. 2C illustrates a cross-sectional view of a step of an exemplary spacer deposition process according to some embodiments.

As shown in FIG. 2B, and in preferred embodiments of the invention the $TiO_xN_y$ film 230 is conformally deposited over the mask feature 220, or features, and substrate 200. After a smooth, substantially amorphous $TiO_xN_y$ thin film has been conformally deposited over a mask feature on a substrate, the $TiO_xN_y$ thin film is directionally etched. As shown in FIG. 2C and in some embodiments the directional etch preferentially etches the $TiO_xN_y$ thin film from the horizontal surfaces 222, 211 of the mask feature 220 and substrate 200 while leaving the $TiO_xN_y$ 231 deposited on the vertical surfaces or sidewalls 221 of the mask feature 220 relatively unetched. In preferred embodiments the directional etch is a reactive ion etch. In preferred embodiments the directional etching removes substantially all of the $TiO_xN_y$ thin film 230 from the horizontal surfaces 222 of the mask feature 220 and substrate 200 while leaving the spacers 231, or the $TiO_xN_y$ deposited on, or extending from the sidewalls 221, or vertical surfaces of the mask feature substantially unetched.

Figure 2D:
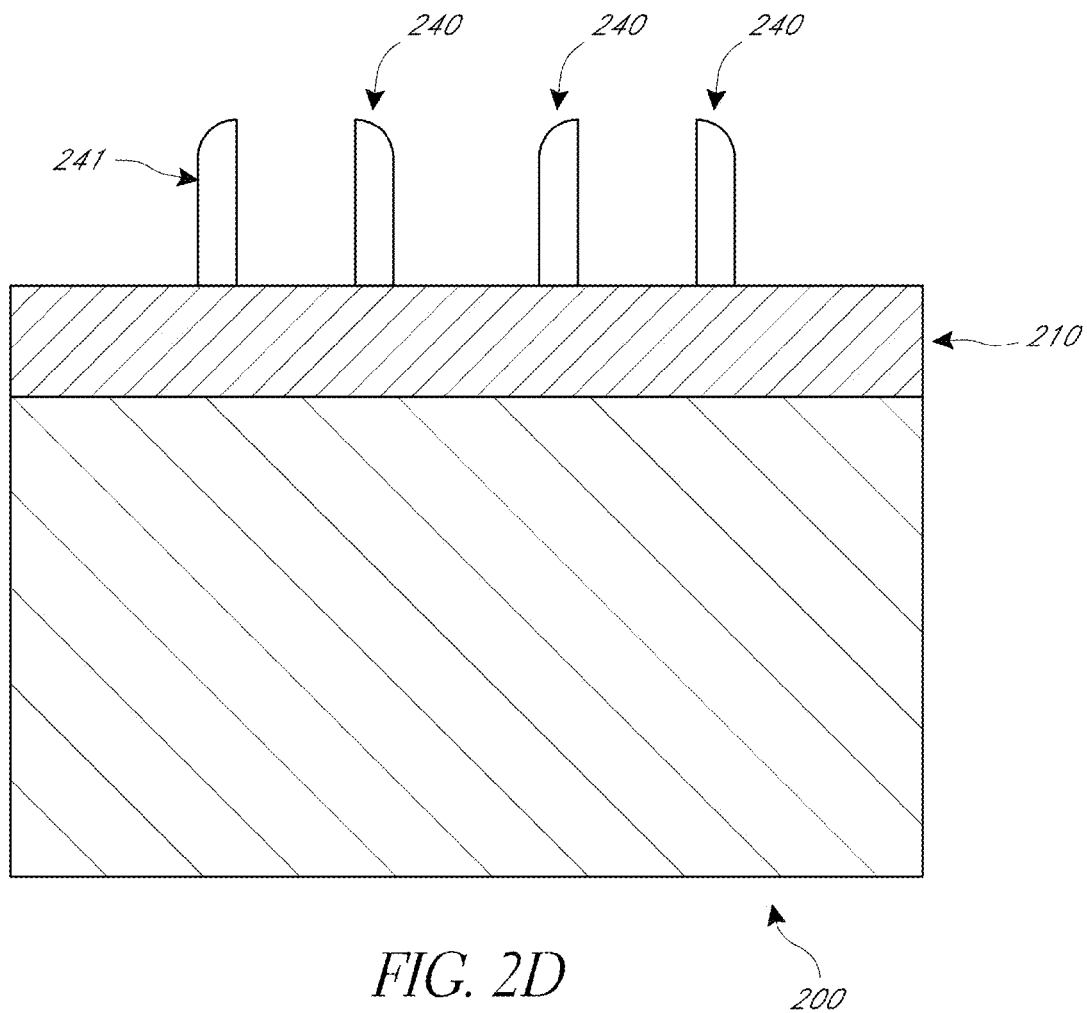
FIG. 2D illustrates a cross-sectional view of a step of an exemplary spacer deposition process according to some embodiments.

As a consequence of this directional etch the $TiO_xN_y$ thin film 231 deposited on or extending from the sidewalls 221 of the mask feature 220, or spacers, and the mask feature remain on the substrate. As shown in FIG. 2D and In some embodiments the mask feature 220 can then be removed with a preferential etch, thereby leaving the free-standing spacers 240 on the substrate 200. In some embodiments the preferential etch is a wet etch. In preferred embodiments the preferential etch is a wet hydrofluoric acid etch. In preferred embodiments of the invention the $TiO_xN_y$ spacers have etch selectivity characteristics such that the preferential etch removes substantially all of the mask feature, while leaving the $TiO_xN_y$ spacers relatively unetched. In preferred embodiments the $TiO_xN_y$ spacers have etch selectivity characteristics substantially similar to those of pure $TiO_2$.

Once the mask feature has been preferentially etched, the $TiO_xN_y$ spacers 231 remain on the substrate 200. The $TiO_xN_y$ which had been deposited on, or extended from the vertical surfaces of the mask feature now comprises the spacers 240. Whereas before there had been one feature, the mask feature, and one space, there are now two features, the $TiO_xN_y$ spacers, and two spaces. Therefore the spacer deposition process has doubled the linear density of features on the substrate, or doubled the pitch.

Additional Applications

The processes described herein can be used to form $TiO_xN_y$ films for use in a variety of contexts, for example, in integrated circuit fabrication. A $TiO_xN_y$ film may be used as, for example, a sacrificial film in patterning applications. $TiO_xN_y$ thin films deposited according to the present disclosure may also be useful as a hard mask layer in integrated circuit fabrication. The inherent surface roughness of a conventional titanium oxide hard mask layer may amplify any latent surface roughness of the underlying substrate. A $TiO_xN_y$ hard mask deposited according to the present disclosure, however, may reduce this problem due to the comparatively higher degree of surface uniformity and lower crystallinity. In some embodiments the deposited $TiO_xN_y$ film has a reduced roughness that is a reduced RMS roughness as compared to a roughness of the substrate before $TiO_xN_y$ deposition. In some embodiments the $TiO_xN_y$ is deposited on top of a sacrificial film on the substrate surface. In some embodiments the $TiO_xN_y$ is deposited on top of polymer or resist film. In some embodiments the $TiO_xN_y$ is used as sacrificial layer or film.

Further, $TiO_xN_y$ thin films deposited according to the present disclosure may be used in photocatalytic applications. The nitrogen in the $TiO_xN_y$ thin film may serve to modify the band gap energy of the film relative to titanium oxide. By controlling the ratio of N containing compounds to O containing compounds in the second reactant the amount of nitrogen, and thus the band gap energy of the resultant $TiO_xN_y$ thin film may be tuned as desired.

$TiO_2$ has the highest refractive index of all the metal oxides and is therefore used in many optical applications. In optical thin films it is often crucial to have a high degree of smoothness, otherwise surface features of the film may disrupt performance. In some embodiments $TiO_xN_y$ films with various refractive indices (R.I.) may be deposited. In some embodiments $TiO_xN_y$ films may be used in optical applications, for example in a CIS (CMOS Image Sensor). $TiO_2$ has also been studied as a gas sensor, as a high-k insulator for MOSFETs and memory applications, such as DRAMs, as a resistance switching material in memristors and in implants due to its biocompatibility. In general, smoothness is a desired film characteristic in many of these applications. $TiO_xN_y$ thin films deposited according to the present disclosure may exhibit increase smoothness over conventional titanium oxide films in these applications. In addition, the nitrogen present in the deposited $TiO_xN_y$ thin film may modify other film properties which may prove beneficial in certain applications.

Example 1

A $TiO_xN_y$ thin film was deposited according to the present disclosure by a PEALD process using TDMAT as the titanium precursor and $O_2+N_2$ plasma as the second reactant. A susceptor temperature of 190° C. was used. Plasma power was about 400 W and the RF on time was about 0.2 seconds. The second reactant was flowed into the chamber with the aid of an Ar carrier gas. The carrier gas flow rate was about 2 slm. The $O_2$ flow rate was about 0.1 slm while the N2 flow rate was about 1.9 slm.

In addition to the $TiO_xN_y$ thin film that was deposited, a titanium oxide reference film was deposited. The titanium oxide thin film was deposited by a PEALD processing using TDMAT as the titanium precursor and $O_2$ plasma as the second reactant. The titanium oxide thin film was deposited at the same susceptor temperature, plasma power, and pressure as the $TiO_xN_y$ thin film. The second reactant was flowed into the chamber with the aid of an Ar carrier gas. The carrier gas flow rate was about 2 slm. The $O_2$ flow rate was about 4 slm.

The WER of the deposited $TiO_xN_y$ thin film in dHF (1:100) was about 68% of the WER of thermal oxide (SiO2). The WER of the titanium oxide thin film in dHF (1:100) was about 57% of the WER of thermal oxide. Therefore, the deposited $TiO_xN_y$ thin film showed similar WER to the titanium oxide thin film.

The titanium oxide thin film growth rate per cycle was found to be 0.059 nm/cycle, while the $TiO_xN_y$ thin film growth rate per cycle was found to be 0.056 nm/cycle.

Dry Etching

Figure 3A:
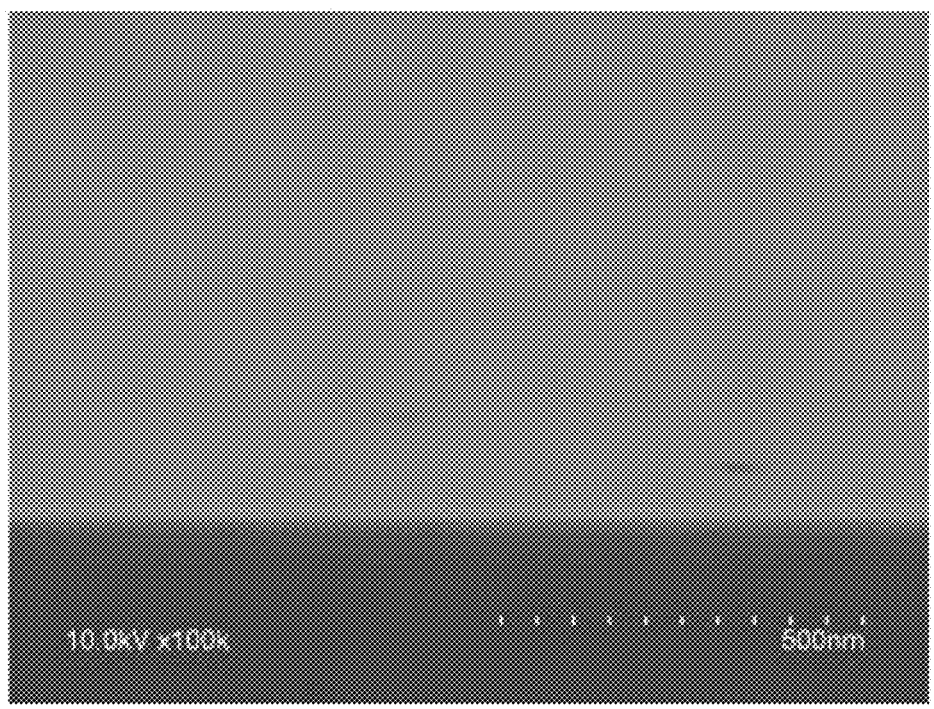
FIG. 3A is a scanning electron micrograph of a reference titanium oxide thin film.
Figure 3B:
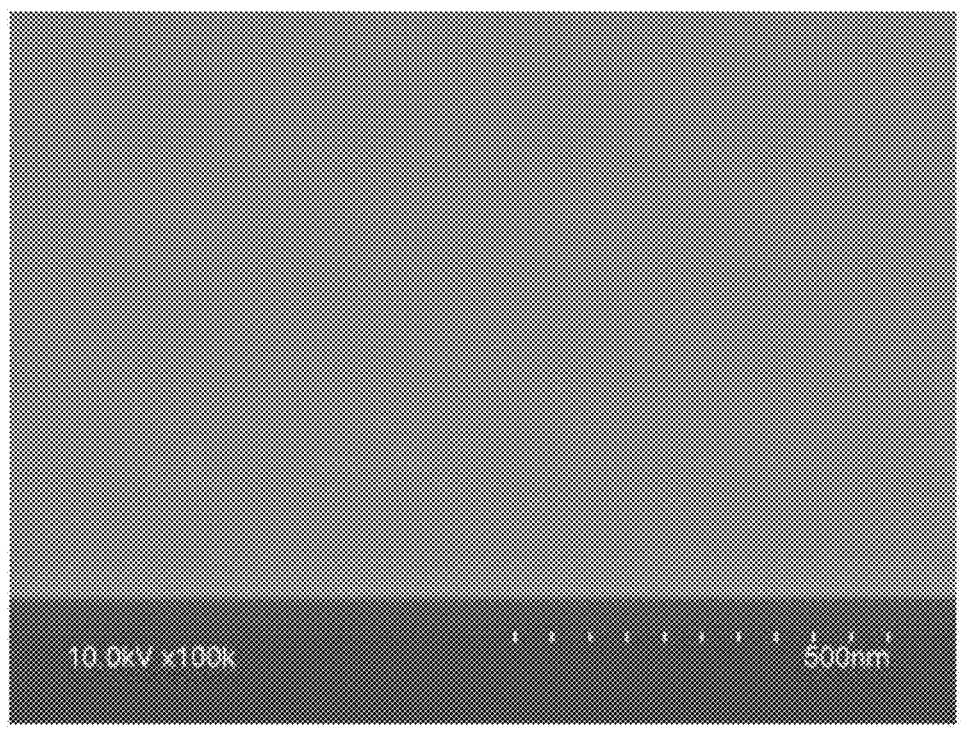
FIG. 3B is a scanning electron micrograph of an exemplary $TiO_xN_y$ film deposited by a deposition process according to some embodiments.

The $TiO_xN_y$ film was deposited to a thickness of 18.7 nm using 300 deposition cycles. The film's growth rate was 0.62 Å/cycle. The deposited $TiO_xN_y$ thin film also showed improved surface roughness over the titanium oxide reference film as shown in Table 1 below. The improved surface roughness can also clearly be seen in FIG. 3A and FIG. 3B, which show SEM images taken of the $TiO_xN_y$ and titanium oxide films. With reference to FIG. 3A, the titanium oxide film showed many bumps dispersed over the surface. While, as can be seen in FIG. 3B, very few bumps were observed on the surface of the $TiO_xN_y$ thin film.

TABLE 1

Surface roughness as measured by AFM.

|  | TiO | TiON |
|---|---|---|
| $R_a$ (nm) | 0.15 | 0.15 |
| $R_z$ (nm) | 16 | 5 |
| $R_q$ (nm) | 0.2 | 0.15 |

The observed step coverage of the deposited $TiO_xN_y$ thin film was greater than 95% for side step coverage and greater than 95% for bottom step coverage. The side step coverage was observed to range from about 91% to about 104%, while the bottom step overage was observed to range from about 96% to about 108%.

The composition of a $TiO_xN_y$ thin film deposited according to the present disclosure was analyzed by XPS. The $TiO_xN_y$ was found to comprise 0.5% carbon and 0.3% nitrogen. While these results are not fully understood, the film properties and etch behavior were nevertheless within the specs for the high quality spacer layer applications.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A process for depositing a titanium oxynitride thin film in integrated circuit fabrication comprising:
    contacting a substrate comprising silicon with a titanium reactant;
    exposing the substrate to a purge gas and/or vacuum to remove excess titanium reactant and reaction byproducts, if any;
    contacting the substrate with a second reactant, wherein the second reactant comprises a plurality of reactive species generated by plasma, wherein the plurality of reactive species comprises nitrogen and oxygen, and wherein a ratio of nitrogen reactive species to oxygen reactive species is from about 1:2 to about 250:1;
    exposing the substrate to a purge gas and/or vacuum to remove excess second reactant and reaction byproducts, if any;
    repeating the contacting and exposing steps until a titanium oxynitride thin film of desired thickness has been formed on the substrate comprising silicon, wherein the titanium oxynitride thin film comprises from about 0.05 at-% to about 30 at-% nitrogen.

2. The process of claim 1, wherein the process is used to form spacers in an integrated circuit fabrication process.

3. The process of claim 1, wherein the process is used to form spacers for use in a pitch multiplication process.

4. The process of claim 1, wherein the titanium oxynitride film is substantially amorphous.

5. The process of claim 1, wherein the substrate comprises a preexisting mask feature.

6. The process of claim 1, wherein the titanium reactant comprises an alkylamine ligand.

7. The process of claim 1, wherein the titanium reactant comprises $Ti(NR^IR^{II})_4$, wherein $R^I$ and $R^{II}$ can be independently selected to be alkyl groups.

8. The process of claim 1, wherein the second reactant comprises a nitrogen precursor and an oxygen precursor.

9. The process of claim 8, wherein the nitrogen precursor comprises $N_2$, $NH_3$, or $N_2H_2$.

10. The process of claim 8, wherein the oxygen precursor comprises $O_2$.

11. The process of claim 1, wherein the reactive species comprises nitrogen atoms, nitrogen ions, nitrogen radicals, or nitrogen plasma and oxygen atoms, oxygen radicals, or oxygen plasma.

12. The process of claim 1, wherein deposition is carried out at a temperature of from about 70° C. to about 200° C.

13. The process of claim 1, wherein the process is a plasma enhanced atomic layer deposition process.

14. A process for depositing a titanium oxynitride thin film, comprising at least one deposition cycle comprising:
    alternately and sequentially contacting a substrate comprising silicon with a titanium reactant and a second reactant comprising a plurality of reactive species including nitrogen reactive species and oxygen reactive species, wherein a ratio of nitrogen reactive species to oxygen reactive species in the second reactant is from about 1:2 to about 250:1; and
    wherein the deposition cycle is repeated two or more times to form the titanium oxynitride thin film on the substrate comprising silicon, wherein the titanium oxynitride thin film comprises from about 0.05 at-% to about 30 at-% nitrogen.

15. The process of claim 14, wherein the process is used to form spacers in an integrated circuit fabrication process.

16. The process of claim 14, wherein the titanium reactant has the formula $Ti(NR^{I}R^{II})_4$, wherein $R^I$ and $R^{II}$ can be independently selected to be Me or Et.

17. The process of claim 14, wherein the second reactant comprises a nitrogen precursor and an oxygen precursor.

18. The process of claim 14, wherein the reactive species comprises nitrogen atoms, nitrogen ions, nitrogen radicals, or nitrogen plasma and oxygen atoms, oxygen radicals, or oxygen plasma.

19. The process of claim 14, wherein the process is a plasma enhanced atomic layer deposition processes.

* * * * *